United States Patent [19]

Van Den Brekel et al.

[11] Patent Number: 4,605,153

[45] Date of Patent: Aug. 12, 1986

[54] SHAPED SOLDER PAD FOR REFLOW SOLDERING OF SURFACE MOUNTING CYLINDRICAL DEVICES ON A CIRCUIT BOARD

[75] Inventors: Jacques Van Den Brekel, Nepean; Thomas K. Y. Ho, Ottawa, both of Canada

[73] Assignee: Northern Telecom Limited, Montreal, Canada

[21] Appl. No.: 745,108

[22] Filed: Jun. 17, 1985

[51] Int. Cl.⁴ .............................................. B23K 3/06
[52] U.S. Cl. .................................. 228/56.3; 228/180.2
[58] Field of Search ........................... 228/56.3, 180.2

[56] References Cited

U.S. PATENT DOCUMENTS 3,778,530 12/1973 Riemann .......................... 228/180.2
4,376,505 3/1983 Wojcik ............................. 228/180.2

Primary Examiner—Nicholas P. Godici
Assistant Examiner—Karen Skillman
Attorney, Agent, or Firm—Sidney T. Jelly

[57] ABSTRACT

A solder pad is provided at each end of a mounting position for a cylindrical electronic device on a circuit board. Each solder pad has two humps of solder spaced apart in a direction normal to the axis of the device, the humps defining a channel in which the end of a device can rest prior to being reflow soldered. The humps have a convex arcuate outer surface in plan view and when viewed in a direction parallel to the axis of the device has a profile which is of convex arcuate form. The humps are formed by depositing a thick patch of solder paste at each hump position and heating the circuit board and solder paste to melt the paste. After positioning of devices, the solder is reflowed to attach the devices.

3 Claims, 2 Drawing Figures

SHAPED SOLDER PAD FOR REFLOW SOLDERING OF SURFACE MOUNTING CYLINDRICAL DEVICES ON A CIRCUIT BOARD

This invention relates to the reflow soldering of surface mounting cylindrical devices on circuit boards. In particular, the invention relates to the shaping of solder pads which hold the cylindrical devices in position until soldered.

Very small devices, such as resistors and capacitors, are used in very large numbers on circuit boards for electric systems, particularly communications systems. These devices are manufactured in a flat rectangular form and in a cylindrical form. Both forms have a contact area at each end. The cylindrical form is very much less expensive than the flat rectangular form.

The rectangular form can be positioned readily on a circuit board and stays in position prior to soldering. The cylindrical form does not stay in position readily. It tends to roll slightly, with the possibility of moving off the solder pads.

The present invention provides a shaped solder pad which acts to retain the cylindrical device in position once it has been positioned on the circuit board. Broadly, a solder pad comprises two spaced humps of solder, the humps spaced to form a channel in which an end of the cylindrical device rests until soldered. The humps, in plan view, also have an arcuate outer edge which assists in maintaining the devices in position and centralizes them, on soldering. Two such solder pads are normally provided at a device mounting position.

The invention will be readily understood by the following description of certain embodiments, by way of example, in conjunction with the accompanying drawings, in which.

Figure 1:
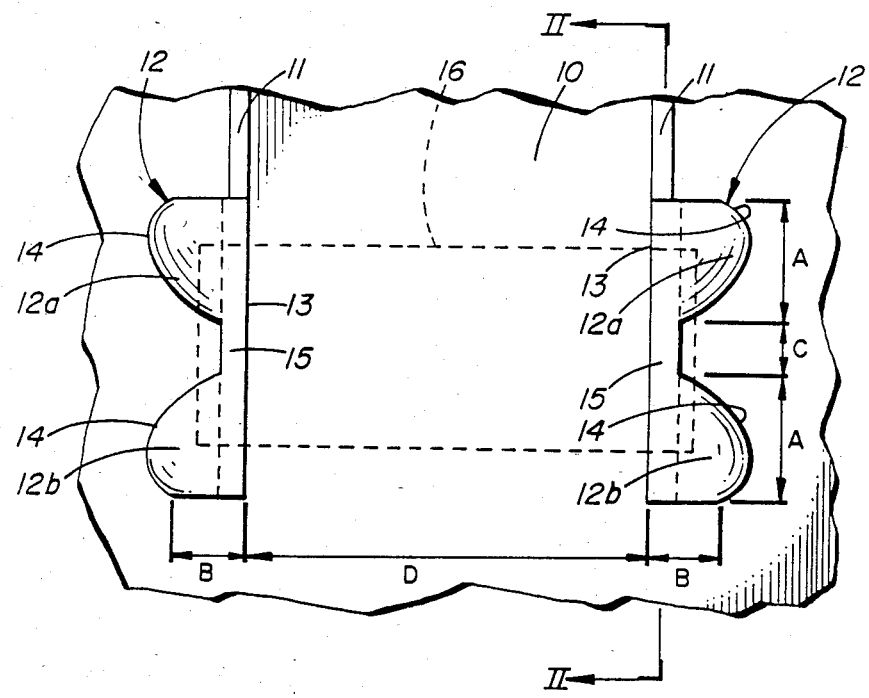
FIG. 1 is a plan view of a mounting position for a device.

As illustrated in FIG. 1 on a circuit board 10 there is a circuit pattern, part of which is seen at 11, with contact or solder pad areas defined. These solder pads are indicated at 12 in FIG. 1, in plan view, and seen in cross-section in FIG. 2. Each solder pad is composed of two humps 12a and 12b. In plan view, the pad has a substantially straight inner edge 13 and each hump has a convex arcuate outer edge 14, usually with an approximately parabolic shape, the two humps joined by a short, generally parallel-sided section 15. In cross-section each hump is of convex arcuate form, and may approach a parabolic shape, with a thin neck portion which corresponds generally to the parallel-sided section, and is similarly identified in FIG. 2. A typical position of a device is shown in dotted outline at 16. The humps, in cross-section, have a somewhat straighter profile at the inner sides, at 17, which subtends an angle of $\theta$ relative to the circuit board surface.

A circuit board is prepared as follows. A circuit pattern is defined on a surface of the board, as by photolithographic etching, and then the circuit pattern is tin plated. Solder paste is then deposited at the various positions where solder pads are required. Where solder humps are required, for the present invention, the thickness of the solder paste is increased, the solder paste being deposited in two separate humps.

Figure 2:
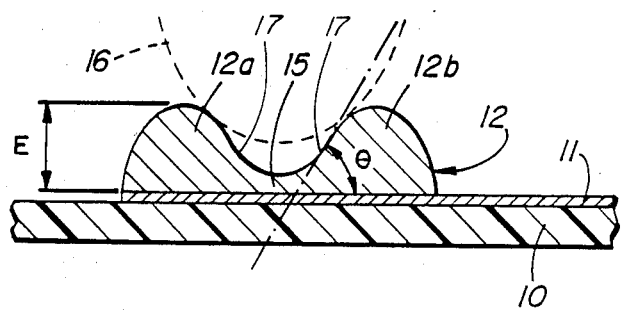
FIG. 2 is a cross-section generally on the line II—II of FIG. 1 after reflow soldering, prior to positioning of a device.

The circuit board is then heated, for example in a vapour, and the solder paste melts and forms two humps generally as in FIG. 2, joined by the thin neck portion 15. The shaping of the solder pad areas on the board—as part of the circuit pattern and as illustrated in FIG. 1, causes the solder to remain as two humps when molten.

The component is then positioned on the solder pads. Application of a flux prior to positioning of the device ensures satisfactory soldering. The board is then reheated—again in a heated vapour—and the solder pad melts. The solder fills in under the device and also forms a concave meniscus along each side at each end. The component settles slightly as the solder melts.

A typical size for a device, or component, is 0.125 inches long by 0.06 inches diameter. Typical dimensions for the solder pad size, and overall dimension, are as follows, with reference to FIG. 1:

$A \cong 0.047$ inches
$B \cong 0.040$ inches
$C \cong 0.02$ inches
$D \cong 0.080$ inches
$\theta \cong 10°$ The height of each hump after the first reflow soldering step, prior to positioning devices, is indicated in FIG. 2 at E, where $E \cong 0.05$ inches.

These figures can vary and an alternative example is:

$A \cong 0.032$ inches
$B \cong 0.035$ inches
$C \cong 0.01$ inches
$D \cong 0.1$ inch
$\theta \cong 15°$ The shaping of the solder pads, particularly the humps, provides a high degree of alignment and centralizing of the device on initial positioning, and also maintains this alignment and centralizing when the solder melts.

The amount of solder paste deposited will depend upon the size of the device.

What is claimed is:

1. A mounting position for mounting a cylindrical surface mounting device on a surface of a circuit board by reflow soldering, comprising two shaped solder pads spaced apart on said surface along an axis, each solder pad having two spaced humps of solder, the humps spaced apart in a direction normal to said axis and defining a channel in which an end of the device can rest prior to reflow soldering, said channel also being of solder; each pad having a straight inner edge extending normal to said axis, the humps each having a convex arcuate outer edge extending along said surface away from said inner edge in a direction parallel to said axis and each hump having a convex arcuate shape viewed in cross-section in a plane normal to said surface and to said axis; the channels being aligned on said axis, the solder pads being spaced along said axis a distance whereby the ends of the device overlie said channels, the end surfaces of the device positioned outside of an outer surface of each channel and inside said arcuate outer edges.

2. A mounting position as claimed in claim 1, each hump having an outer edge of approximately parabolic shape and having a profile, viewed in a direction parallel to said axis, of substantially parabolic shape.

3. A method of using a shaped solder pad mounting position for reflow soldering a cylindrical component on a circuit board, comprising:

defining a circuit pattern on a surface of a circuit board;

tin plating the circuit pattern;
applying solder paste on said circuit pattern at mounting positions for cylindrical surface mounting devices, the solder paste being deposited in two humps at each end of said position;
heating said circuit board and melting said solder paste to form two spaced solder pads, spaced apart on said surface along an axis, each solder pad having a straight inner edge extending normal to said axis and two humps of solder, the humps spaced apart in a direction normal to said axis and defining a channel in which an end of the device can be positioned prior to reflow soldering, and also forming a layer of solder at said channel;
the humps each having a convex arcuate outer edge extending along said surface away from said inner edge in a direction parallel to said axis and a convex arcuate profile when viewed in a direction normal to said axis.

* * * * *